US009231631B1

(12) United States Patent
Ke et al.

(10) Patent No.: US 9,231,631 B1
(45) Date of Patent: Jan. 5, 2016

(54) CIRCUITS AND METHODS FOR ADJUSTING THE VOLTAGE SWING OF A SIGNAL

(71) Applicant: Altera Corporation, San Jose, CA (US)

(72) Inventors: Yanjing Ke, Union City, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/311,192

(22) Filed: Jun. 20, 2014

(51) Int. Cl.
*H03K 19/003* (2006.01)
*H03K 19/0175* (2006.01)
*H04B 1/10* (2006.01)
*H04L 25/02* (2006.01)
*H03K 19/00* (2006.01)

(52) U.S. Cl.
CPC .......... *H04B 1/1036* (2013.01); *H03K 19/0005* (2013.01); *H03K 19/00361* (2013.01); *H04L 25/0278* (2013.01); *H04L 25/0286* (2013.01); *H04B 2001/1045* (2013.01)

(58) Field of Classification Search
CPC .............. H04L 25/0278; H04L 25/028; H04L 25/0298; H04L 25/0292; H04L 25/03343; H04L 7/0037; H04L 25/0272; H03K 19/0005; H03K 19/00384; H03K 19/00369; H03K 19/018571; H03K 17/687; H03K 19/018557; H03K 19/018585; G06F 13/4086; G06F 13/4072; H03F 1/56
USPC ............ 326/30, 82, 83, 86; 375/257; 327/108
See application file for complete search history.

(56) References Cited

U.S. PATENT DOCUMENTS

| 6,977,534 | B2 | 12/2005 | Radelinow |
| 7,368,902 | B2 * | 5/2008 | Clements et al. ............. 324/601 |
| 8,174,294 | B1 | 5/2012 | Ding et al. |
| 8,415,986 | B2 | 4/2013 | Seth et al. |
| 8,446,169 | B1 * | 5/2013 | Marlett et al. ................... 326/30 |
| 8,520,348 | B2 * | 8/2013 | Dong .............................. 361/56 |
| 8,618,833 | B1 * | 12/2013 | Bergkvist et al. ............... 326/30 |
| 8,749,268 | B2 * | 6/2014 | Menolfi et al. ................... 326/30 |
| 8,760,188 | B2 * | 6/2014 | Gondi et al. ..................... 326/30 |
| 8,854,108 | B1 * | 10/2014 | Suzuki ........................... 327/379 |
| 8,885,435 | B2 * | 11/2014 | Gondi et al. .................. 365/226 |
| 2013/0343471 | A1 * | 12/2013 | Suzuki et al. ................. 375/257 |
| 2014/0181845 | A1 * | 6/2014 | Jing et al. ...................... 719/321 |

OTHER PUBLICATIONS

Marcel Kossel, et al., "A T-Coil-Enhanced 8.5 Gb/s High-Swing SST Transmitter in 65 nm Bulk CMOS With <—16 dB Return Loss Over 10 GHz Bandwidth," IEEE Journal of Solid-State Circuits, vol. 43, No. 12, Dec. 2008, pp. 2905-2920.
Christian Menolfi, et al., "A 16Gb/s Source-Series Terminated Transmitter in 65nm CMOS SOI," 2007 IEEE International Solid-State Circuits Conference, Feb. 14, 2007, pp. 446-447, 614.
Altera Corporation, "Arria 10 Transceiver PHY User Guide," Dec. 2, 2013, pp. 1-432.
Altera Corporation, "Understanding the Pre-Emphasis and Linear Equalization Features in Stratix IV GX Devices," Application Note AN-602-1.0, Nov. 2010, pp. 1-16.

* cited by examiner

*Primary Examiner* — Vibol Tan
(74) *Attorney, Agent, or Firm* — Steven J. Cahill

(57) ABSTRACT

A driver circuit includes unit slice circuits that generate an output data signal based on an input data signal. The driver circuit reduces a voltage swing of the output data signal without changing a termination resistance of the driver circuit in response to decreasing a number of the unit slice circuits that generate the output data signal based on the input data signal.

21 Claims, 10 Drawing Sheets

CIRCUITS AND METHODS FOR ADJUSTING THE VOLTAGE SWING OF A SIGNAL

FIELD OF THE DISCLOSURE

The present disclosure relates to electronic circuits, and more particularly to circuits and methods for adjusting the voltage swing of a signal.

BACKGROUND

In a data transmission system, one or more data signals are transmitted from a transmitter to a receiver through external transmission links. At a high data rate in the data signal, the unit interval (UI) of each bit in the data signal is very small (e.g., 400 picoseconds at 2.5 gigabit/second). When the data signal flips to the opposite logic state after a sequence of bits in the data signal having the same logic state, capacitors in the transmission links may cause the voltage of the data signal to change too slowly. The effects of the capacitors in the transmission links may cause inter-symbol interference (ISI) in the data signal received by the receiver. ISI may have a negative impact on the performance of the data transmission system.

For example, if the transmitter transmits a sequence of five logical 1 bits (i.e., '11111'), the sequence of logical 1 bits charges the capacitors in the transmission links. If the transmitter then transmits a logical 0 bit and then another sequence of logical 1 bits, the capacitors in the transmission links may not discharge fast enough to a voltage that accurately represents the logical 0 in the sixth bit. ISI may cause the receiver to misread the sixth bit as a logical 1 instead of a logical 0.

BRIEF SUMMARY

According to some embodiments, a driver circuit includes unit slice circuits that generate an output data signal based on an input data signal. The driver circuit reduces a voltage swing of the output data signal without changing a termination resistance of the driver circuit in response to decreasing a number of the unit slice circuits that generate the output data signal based on the input data signal.

Various objects, features, and advantages of the present invention will become apparent upon consideration of the following detailed description and the accompanying drawings.

DETAILED DESCRIPTION

A current mode driver circuit, such as a current mode logic circuit or an H-bridge circuit, can be used to transmit a data signal in a data transmission system. Alternatively, a voltage mode driver circuit can be used to transmit a data signal in a data transmission system. A voltage mode driver circuit typically consumes substantially less power than a comparable current mode driver circuit. Many high-speed data transmission systems would benefit from lower power consumption in the transmitter.

Various data transmission protocols may require transmitters to provide different voltage amplitudes in the transmitted data signal. The output current of some voltage mode driver circuits cannot be accurately controlled to generate the different voltage amplitudes in the transmitted data signal that may be required by multiple different data transmission protocols. According to some embodiments disclosed herein, a voltage mode driver circuit can be programmed to vary the voltage amplitude of its output data signal according to different data transmission protocols without affecting the termination resistance, as described in further detail below. The voltage amplitude of a signal is also referred to herein as the voltage swing of a signal.

Figure 1A:
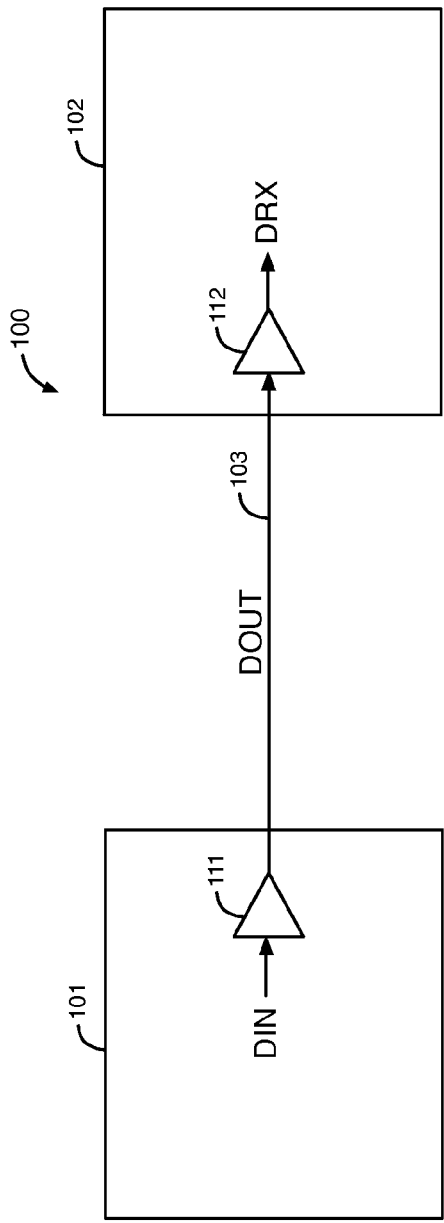
FIG. 1A illustrates an example of a single-ended data transmission system, according to an embodiment of the present invention.

FIG. 1A illustrates an example of a single-ended data transmission system 100, according to an embodiment of the present invention. Single-ended data transmission system 100 includes a first integrated circuit 101, a second integrated circuit 102, and a transmission link 103. Integrated circuit 101 includes a single-ended transmitter circuit 111. Integrated circuit 102 includes a receiver circuit 112. Transmission link 103 has conductors and connectors including one or more transmission lines and a pad on each integrated circuit 101-102.

Transmitter circuit 111 receives an input data signal DIN containing bits received from inside integrated circuit 101. Transmitter circuit 111 generates a single-ended output data signal DOUT based on the input data signal DIN. Transmitter circuit 111 causes output data signal DOUT to indicate the same sequence of bits as data signal DIN. Data signal DOUT is transmitted through transmission link 103 to an input of receiver circuit 112. Receiver circuit 112 generates a data signal DRX based on the data signal DOUT received from the transmission link 103. Receiver circuit 112 causes data signal DRX to indicate the same sequence of bits as data signal DOUT.

Figure 1B:
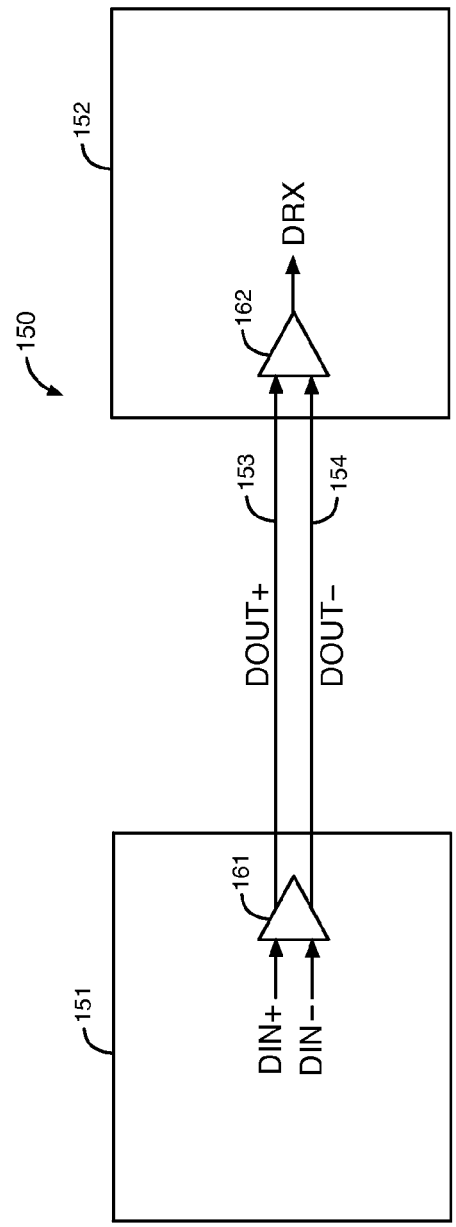
FIG. 1B illustrates an example of a differential data transmission system, according to an embodiment of the present invention.

FIG. 1B illustrates an example of a differential data transmission system 150, according to an embodiment of the present invention. Differential data transmission system 150 includes a first integrated circuit 151, a second integrated circuit 152, and differential transmission links 153-154. Integrated circuit 151 includes a differential transmitter circuit 161. Integrated circuit 152 includes a receiver circuit 162. Transmission links 153-154 have conductors and connectors including transmission lines and pads on each of the integrated circuits 151-152.

Transmitter circuit 161 receives input data signals DIN+ and DIN− containing bits from inside integrated circuit 151. Data signal DIN− has the opposite polarity of data signal DIN+. The difference between data signals DIN+ and DIN− is a differential input data signal DIN+/DIN−. Transmitter circuit 161 generates output data signals DOUT+ and DOUT− based on the differential input data signal DIN+/DIN−. Data signal DOUT− has the opposite polarity of data signal DOUT+. The difference between output data signals DOUT+ and DOUT− is a differential output data signal DOUT+/DOUT−. Differential data signal DOUT+/DOUT− may indicate serial data bits. Alternatively, differential data signal DOUT+/DOUT− may be one of multiple signals that indicate parallel data bits.

Transmitter circuit 161 causes output data signal DOUT+/DOUT− to indicate the same sequence of bits as data signal DIN+/DIN−. Data signal DOUT+/DOUT− is transmitted through transmission links 153-154 to inputs of receiver circuit 162. Receiver circuit 162 generates a data signal DRX based on the differential data signal DOUT+/DOUT− received from the transmission links 153-154. Receiver circuit 162 causes data signal DRX to indicate the same sequence of bits as differential data signal DOUT+/DOUT−. Data signal DRX may be single-ended or differential.

If a data signal has a high data rate, capacitors in the transmission links may cause the voltage of the data signal to change too slowly, causing ISI in the received data signal, as described above. In order to reduce ISI in the received data signal, a transmitter circuit may pre-emphasize or de-emphasize the voltages representing some of the bits in the data signal relative to other bits in the data signal. For example, a transmitter circuit may pre-emphasize the voltage of the first bit in a sequence of bits having the same logic state in the data signal relative to the voltages of the second and subsequent bits in the sequence. In this example, the transmitter circuit de-emphasizes the voltages of the second and subsequent bits in a sequence of bits having the same logic state in the data signal relative to the first bit in the sequence in order to reduce ISI in the received data signal. In some embodiments, pre-emphasis and de-emphasis may be referring to the same technique. Pre-emphasis and de-emphasis are also referred to as emphasis.

A transmitter circuit using emphasis causes the voltages of some of the bits in the data signal to be different than other bits in the data signal that have the same logic state. The transmitter circuit uses emphasis to vary the drive current strength used to generate some of the bits in the data signal to overcome the effects of ISI in the transmission links caused by a sequence of bits having the same logic state. Emphasis allows the receiver circuit to be able to correctly determine the logic state of each bit in the received data signal.

Figure 2A:
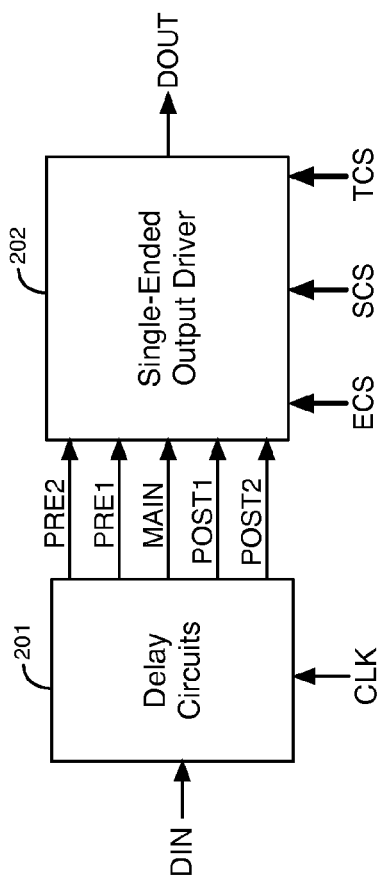
FIG. 2A illustrates delay circuits and a single-ended output driver circuit in the single-ended transmitter circuit of FIG. 1A, according to an embodiment of the present invention.

FIG. 2A illustrates delay circuits 201 and a single-ended output driver circuit 202, according to an embodiment of the present invention. Delay circuits 201 and single-ended output driver circuit 202 are in single-ended transmitter circuit 111 in integrated circuit 101. Delay circuits 201 receive the input data signal DIN and a periodic clock signal CLK. Delay circuits 201 generate five data signals PRE2, PRE1, MAIN, POST1, and POST2 based on data signal DIN. Delay circuits 201 delay the bits received in the input data signal DIN to generate corresponding bits in the five data signals PRE2, PRE1, MAIN, POST1, and POST2 in response to clock signal CLK.

Delay circuits 201 cause the first pre-tap data signal PRE1 to be delayed by one unit interval (i.e., one bit period) of the data signal relative to the second pre-tap data signal PRE2. Delay circuits 201 cause data signal MAIN to be delayed by one unit interval of the data signal relative to the first pre-tap data signal PRE1. Delay circuits 201 cause the first post-tap data signal POST1 to be delayed by one unit interval of the data signal relative to data signal MAIN. Delay circuits 201 cause the second post-tap data signal POST2 to be delayed by one unit interval of the data signal relative to the first post-tap data signal POST1. Delay circuits 201 may, for example, include five shift register circuits. In this example, each of the five shift register circuits delays the bits received in data signal DIN by the appropriate number of unit intervals in response to clock signal CLK to generate one of the data signals PRE2, PRE1, MAIN, POST1, and POST2. The period of clock signal CLK may be, for example, equal to or twice the unit interval of data signal DIN.

Data signals PRE2, PRE1, MAIN, POST1, and POST2 are provided to five inputs of single-ended output driver circuit 202. Single-ended output driver circuit 202 generates single-ended output data signal DOUT based on data signal MAIN and based on one, two, three or all four of data signals PRE2, PRE1, POST1, and POST2. Output driver circuit 202 causes output data signal DOUT to indicate the same bits that are indicated by data signal MAIN in the same order.

Output driver circuit 202 may use one or both of data signals PRE1 and PRE2 for pre-emphasis of selected bits in the data signal DOUT. Output driver circuit 202 may use one or both of data signals POST1 and POST2 for de-emphasis of selected bits in data signal DOUT. Output driver circuit 202 applies emphasis to output data signal DOUT to reduce ISI in the transmission links as discussed in further detail below. Output driver circuit 202 also uses three sets of control signals ECS, SCS, and TCS to generate data signal DOUT. Further details of exemplary embodiments of output driver circuit 202 are shown in and described below with respect to FIGS. 3-6.

Figure 2C:
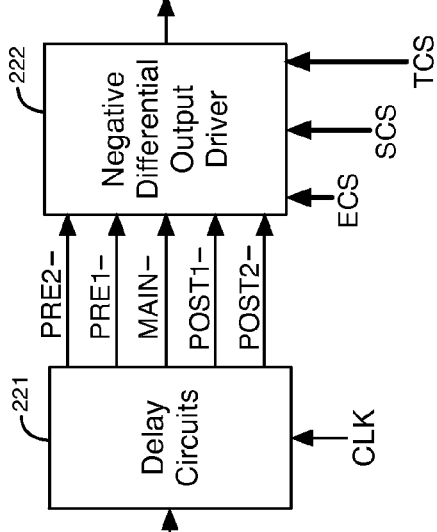
FIGS. 2B-2C illustrate portions of the differential transmitter circuit of FIG. 1B, according to an embodiment of the present invention.
Figure 2B:
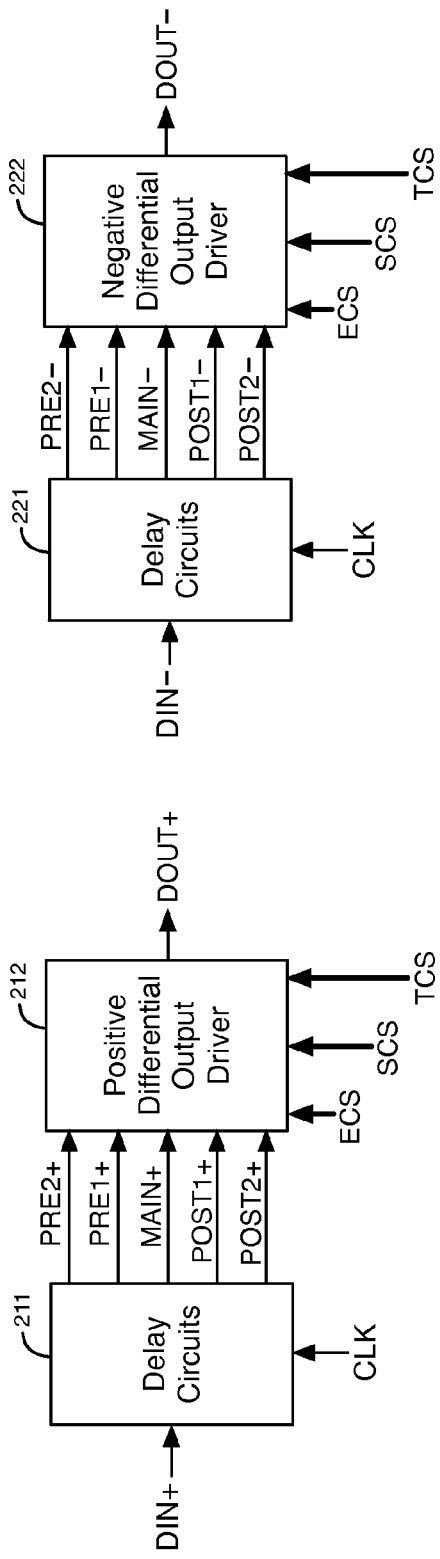

FIGS. 2B-2C illustrate portions of differential transmitter circuit 161, according to an embodiment of the present invention. FIG. 2B illustrates delay circuits 211 and positive differential output driver circuit 212. Delay circuits 211 receive positive data signal DIN+ and clock signal CLK. FIG. 2C illustrates delay circuits 221 and negative differential output driver circuit 222. Delay circuits 221 receive negative data signal DIN− and clock signal CLK.

Referring to FIG. 2B, delay circuits 211 delay the bits received in positive data signal DIN+ to generate corresponding bits in five positive data signals PRE2+, PRE1+, MAIN+, POST1+, and POST2+ in response to clock signal CLK. Delay circuits 211 cause data signal PRE1+ to be delayed by 1 unit interval (UI) relative to data signal PRE2+, data signal MAIN+ to be delayed by 1 UI relative to data signal PRE1+, data signal POST1+ to be delayed by 1 UI relative to data signal MAIN+, and data signal POST2+ to be delayed by 1 UI relative to data signal POST1+. Delay circuits 211 may, for example, include five shift register circuits, as discussed above with respect to delay circuits 201.

Data signals PRE2+, PRE1+, MAIN+, POST1+, and POST2+ are provided to five inputs of output driver circuit 212. Output driver circuit 212 generates positive output data signal DOUT+ based on data signal MAIN+ and based on one or more of data signals PRE2+, PRE1+, POST1+, and POST2+. Output driver circuit 212 causes output data signal DOUT+ to indicate the same bits that are indicated by data signal MAIN+ in the same order.

Output driver circuit 212 may use one or both of data signals PRE2+ and PRE1+ for pre-emphasis of selected bits in the data signal DOUT+. Output driver circuit 212 may use one or both of data signals POST2+ and POST1+ for de-emphasis of selected bits in data signal DOUT+. Output driver circuit 212 applies pre-emphasis and/or de-emphasis to output data signal DOUT+ to reduce ISI in the transmission links as discussed in further detail below. Output driver circuit 212 also uses the three sets of control signals ECS, SCS, and TCS to generate data signal DOUT+. Further details of exemplary embodiments of output driver circuit 212 are shown in and described below with respect to FIGS. 3-6.

Referring to FIG. 2C, delay circuits 221 delay the bits received in negative data signal DIN− to generate corresponding bits in five negative data signals PRE2−, PRE1−, MAIN−, POST1−, and POST2− in response to clock signal CLK. Delay circuits 221 cause data signal PRE1− to be delayed by 1 unit interval (UI) relative to data signal PRE2−, data signal MAIN− to be delayed by 1 UI relative to data signal PRE1−, data signal POST1− to be delayed by 1 UI relative to data signal MAIN−, and data signal POST2− to be delayed by 1 UI relative to data signal POST1−. Delay circuits 221 may, for example, include five shift register circuits, as discussed above with respect to delay circuits 201.

Data signals PRE2−, PRE1−, MAIN−, POST1−, and POST2− are provided to five inputs of output driver circuit 222. Output driver circuit 222 generates negative output data signal DOUT− based on data signal MAIN− and based on one or more of data signals PRE2−, PRE1−, POST1−, and POST2−. Output driver circuit 222 causes output data signal DOUT− to indicate the same bits that are indicated by data signal MAIN− in the same order. In some embodiments, the bits in output data signals DOUT+ and DOUT− are inverted relative to the corresponding bits in data signals MAIN+ and MAIN−, respectively.

Output driver circuit 222 may use one or both of data signals PRE2− and PRE1− for pre-emphasis of selected bits in data signal DOUT−. Output driver circuit 222 may use one or both of data signals POST2− and POST1− for de-emphasis of selected bits in data signal DOUT−. Output driver circuit 222 applies pre-emphasis and/or de-emphasis to output data signal DOUT− to reduce ISI in the transmission links as discussed in further detail below. Output driver circuit 222 also uses the three sets of control signals ECS, SCS, and TCS to generate data signal DOUT−. Further details of exemplary embodiments of output driver circuit 222 are shown in and described below with respect to FIGS. 3-6.

Figure 2D:
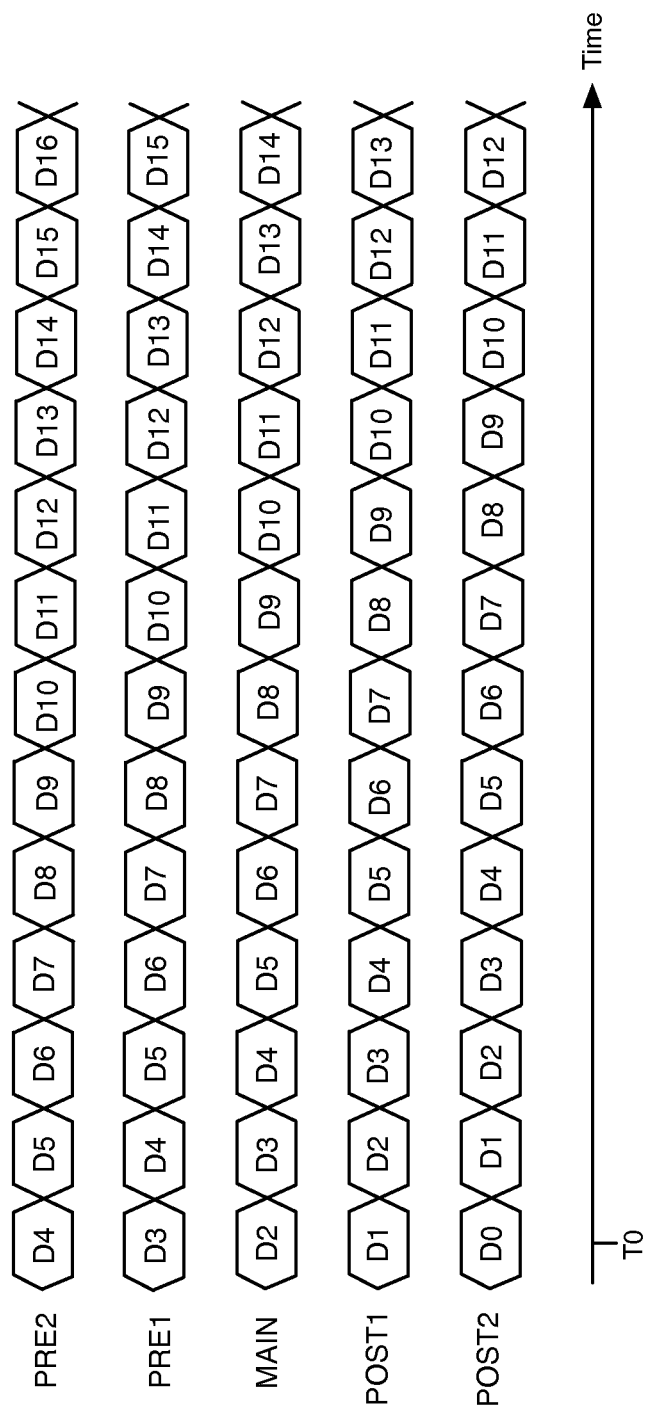
FIG. 2D is a timing diagram that illustrates examples of waveforms for data signals shown in FIG. 2A, according to an embodiment of the present invention.

FIG. 2D is a timing diagram that illustrates examples of waveforms for data signals PRE2, PRE1, MAIN, POST1, and POST2, according to an embodiment of the present invention. In FIG. 2D, D0-D16 indicate 17 different data bits in the data signals. The duration of each of the data bits in the corresponding data signal, including each of data bits D0-D16, is one unit interval (i.e., one bit period).

As shown in FIG. 2D, the bits in data signal PRE1 are delayed by 1 unit interval (UI) relative to the corresponding bits in data signal PRE2. The bits in data signal MAIN are delayed by 1 UI relative to the corresponding bits in data signal PRE1. The bits in data signal POST1 are delayed by 1 UI relative to the corresponding bits in data signal MAIN. The bits in data signal POST2 are delayed by 1 UI relative to the bits in data signal POST1. As an example, data signals PRE2, PRE1, MAIN, POST1, and POST2 indicate bits D4, D3, D2, D1, and D0, respectively, at the same time T0, as shown in FIG. 2D.

According to another exemplary embodiment, data signals PRE2+, PRE1+, MAIN+, POST1+, and POST2+ have the same relative delays that are shown for data signals PRE2, PRE1, MAIN, POST1, and POST2, respectively, in FIG. 2D. The bits indicated by data signals PRE2−, PRE1−, MAIN−, POST1−, and POST2− have the same relative delays as the bits indicated by data signals PRE2+, PRE1+, MAIN+, POST1+, and POST2+, respectively. The bits indicated by data signals PRE2−, PRE1−, MAIN−, POST1−, and POST2− are inverted relative to the corresponding bits indicated by data signals PRE2+, PRE1+, MAIN+, POST1+, and POST2+, respectively.

Figure 3:
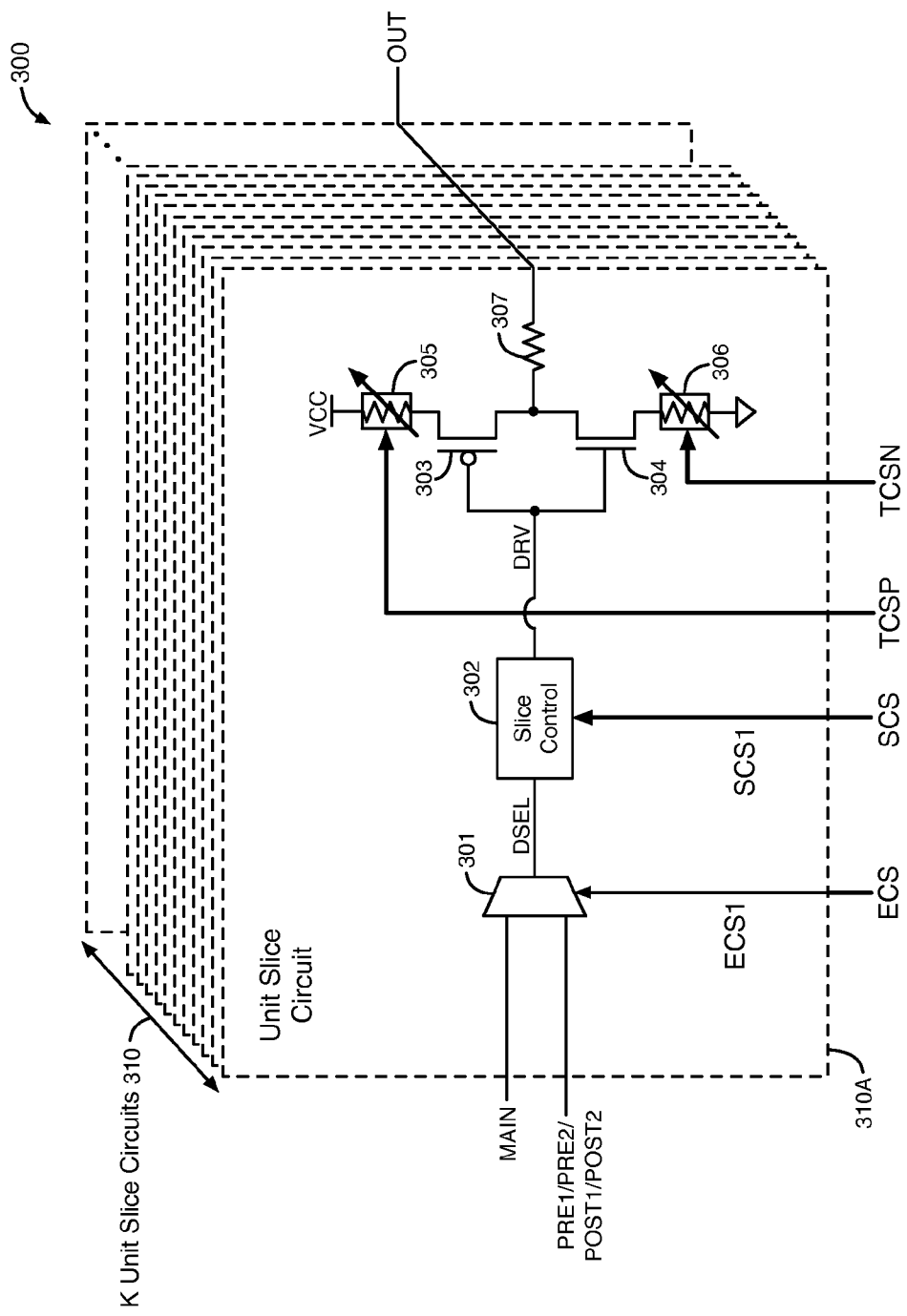
FIG. 3 illustrates an example of an output driver circuit, according to an embodiment of the present invention.

FIG. 3 illustrates an example of an output driver circuit 300, according to an embodiment of the present invention. Output driver circuit 300 is an example of each of output driver circuits 202, 212, and 222. In some embodiments, each of the output driver circuits 202, 212, and 222 includes an instance of output driver circuit 300. Output driver circuit 300 functions as a buffer circuit to buffer one or more input data signals to generate an output data signal OUT.

Output driver circuit 300 is a voltage mode driver circuit. As a voltage mode driver circuit, output driver circuit 300 typically consumes less power than a current mode driver circuit, such as a current mode logic driver circuit or an H-bridge driver circuit. Output driver circuit 300 can be programmed to vary the voltage amplitude (i.e., the voltage swing) of its output data signal OUT according to different data transmission protocols, as described in further detail below.

Output driver circuit 300 receives data signals PRE2, PRE1, MAIN, POST1, and POST2 as input signals. Output driver circuit 300 generates an output data signal OUT at its output based on data signal MAIN. Output driver circuit 300 may also generate output data signal OUT based on one or more of data signals PRE2, PRE1, POST1, and POST2. Signals PRE2, PRE1, MAIN, POST1, POST2, and OUT in FIG. 3 are signals PRE2+, PRE1+, MAIN+, POST1+, POST2+, and OUT+, respectively, in the embodiment of FIG. 2B. Signals PRE2, PRE1, MAIN, POST1, POST2, and OUT in FIG. 3 are signals PRE2−, PRE1−, MAIN−, POST1−, POST2−, and OUT−, respectively, in the embodiment of FIG. 2C. Output driver circuit 300 also receives four sets of control signals ECS, SCS, TCSP, and TCSN as input signals. Control signals TCSP and TCSN are collectively identified as signals TCS in FIGS. 2A-2C.

Referring to FIG. 3, output driver circuit 300 includes a K number of unit slice circuits 310 that are coupled in parallel at the output of output driver circuit 300. K may be any positive integer greater than 1. An exemplary number of unit slice circuits 310 are shown in FIG. 3. FIG. 3 shows an exemplary unit slice circuit 310A that is one of the unit slice circuits 310. Unit slice circuit 310A includes multiplexer circuit 301, slice control circuit 302, p-channel transistor 303, n-channel transistor 304, adjustable resistor circuit 305, adjustable resistor circuit 306, and resistor 307. Each of the other K unit slice circuits 310 in output driver circuit 300 also includes a multiplexer circuit 301, a slice control circuit 302, a p-channel transistor 303, an n-channel transistor 304, adjustable resistor circuits 305-306, and a resistor 307 that are coupled as shown in FIG. 3 for unit slice circuit 310A. Transistors 303-304 may be, for example, metal oxide semiconductor field-effect transistors (MOSFETs).

Data signal MAIN is provided to a first multiplexing input of multiplexer circuit 301. One of the data signals PRE2, PRE1, POST1, or POST2 is provided to a second multiplexing input of multiplexer circuit 301. Each of the unit slice circuits 310 receives one of the data signals PRE2, PRE1, POST1, or POST2 at the second multiplexing input of multiplexer circuit 301. Different subsets of the unit slice circuits 310 may receive different ones of the data signals PRE2, PRE1, POST1, and POST2, as shown in and described below with respect to FIG. 4.

Emphasis control signals ECS are provided to the unit slice circuits 310. The multiplexer circuit 301 in each unit slice circuit 310 receives one of the emphasis control signals ECS at its select input. The multiplexer circuit 301 in each unit slice circuit 310 generates a data signal DSEL at its output based on the data signal at its first or second multiplexing input. In each of the unit slice circuits 310, the control signal ECS received by the multiplexer circuit 301 in that unit slice circuit determines which of the two data signals that multiplexer circuit 301 selects to generate data signal DSEL.

For example, emphasis control signal ECS1 is provided to the select input of multiplexer circuit 301 in unit slice circuit 310A. Emphasis control signal ECS1 is one of emphasis control signals ECS. Control signal ECS1 determines which data signal multiplexer circuit 301 in unit slice circuit 310A selects to generate data signal DSEL. If signal ECS1 is in a first logic state, multiplexer circuit 301 provides the bits indicated by data signal MAIN to data signal DSEL. If signal ECS1 is in a second logic state, multiplexer circuit 301 provides the bits indicated by the data signal received at its second multiplexing input (PRE2, PRE1, POST1, or POST2) to data signal DSEL.

The data signal DSEL in each unit slice circuit 310 is provided to an input of slice control circuit 302 in the respective one of the unit slice circuits 310. Slice control signals SCS are provided to the unit slice circuits 310. A subset of the slice control signals SCS are provided to inputs of the slice control circuit 302 in each of the unit slice circuits 310. Slice control circuit 302 generates a signal DRV at its output. The slice control signals SCS determine whether slice control circuit 302 generates signal DRV based on data signal DSEL or based on one or more other signals.

For example, slice control signals SCS1 are provided to slice control circuit 302 in unit slice circuit 310A. Slice control signals SCS1 determine whether slice control circuit 302 in unit slice circuit 310A generates signal DRV based on data signal DSEL or based on other signals. If signals SCS1 have a first set of values, slice control circuit 302 drives the voltage of signal DRV to the high supply voltage VCC. If signals SCS1 have a second set of values, slice control circuit 302 provides the bits indicated by data signal DSEL to signal DRV. If signals SCS1 have a third set of values, slice control circuit 302 drives the voltage of signal DRV to the ground voltage. Further details of slice control circuit 302 are shown in and described below with respect to FIG. 5.

In each of the unit slice circuits 310, signal DRV is provided to the gate of p-channel transistor 303 and to the gate of n-channel transistor 304. The gates of transistors 303-304 are control inputs. When signal DRV is in a logic low state (e.g., at the ground voltage), p-channel transistor 303 is on, n-channel transistor 304 is off, and current flows from the supply rail at supply voltage VCC through adjustable resistor 305, transistor 303, and resistor 307 to the output of output driver circuit 300. Output driver circuit 300 generates an output data signal OUT at its output.

When signal DRV is in a logic high state (e.g., at supply voltage VCC), p-channel transistor 303 is off, n-channel transistor 304 is on, and current flows from the output of output driver 300 through resistor 307, transistor 304, and adjustable resistor 306 to the ground rail. The ground rail is at the ground voltage. The ground voltage is a low supply voltage that may be at zero volts or at a positive or negative non-zero voltage.

Adjustable resistor circuit 305, adjustable resistor circuit 306, and resistor 307 provide termination resistance at the output of output driver circuit 300. When the p-channel transistor 303 is on in one of the unit slice circuits 310, the termination resistance of that unit slice circuit approximately equals the resistance of adjustable resistor circuit 305 plus the resistance of resistor 307. When the n-channel transistor 304 is on in one of the unit slice circuits 310, the termination resistance of that unit slice circuit approximately equals the resistance of adjustable resistor circuit 306 plus the resistance of resistor 307. In some embodiments, the resistance of adjustable resistor circuit 306 equals the resistance of adjustable resistor circuit 305 in each unit slice circuit 310. The resistance of each of transistors 303-304 is small when the respective transistor 303-304 is on.

The K unit slice circuits 310 are coupled together in parallel at the output of output driver circuit 300. The total termination resistance at the output of output driver circuit 300 equals the termination resistance of the K number of unit slice circuits 310 coupled in parallel. The total termination resistance at the output of output driver circuit 300 is selected to match the characteristic impedance of the transmission line coupled to the output of output driver circuit 300 in order to reduce signal reflection in the output data signal OUT transmitted through the transmission line.

The resistance of resistor 307 in each unit slice circuit 310 is fixed. The resistances of adjustable resistor circuits 305-306 in each unit slice circuit 310 can be adjusted to change the total termination resistance at the output of output driver circuit 300. Termination control signals TCSP and TCSN are provided to control inputs of adjustable resistor circuits 305 and 306, respectively, in each of the unit slice circuits 310. Termination control signals TCSP control the resistance of adjustable resistor circuit 305. Termination control signals TCSN control the resistance of adjustable resistor circuit 306. Termination control signals TCSP and TCSN are changed to adjust the resistances of adjustable resistor circuits 305 and 306, respectively.

Adjusting the resistances of adjustable resistor circuits 305-306 changes the total termination resistance at the output of output driver circuit 300. The ability to adjust the termination resistance at the output of output driver circuit 300 using control signals TCSP and TCSN is advantageous, for example, if the characteristic impedance of the transmission line to be coupled to output driver circuit 300 is not known during the manufacture of the integrated circuit that contains output driver circuit 300. The characteristic impedance of the transmission line to be coupled to output driver circuit 300 may not be known during the manufacture of the integrated circuit, for example, if the integrated circuit may be used to transmit data signals externally according to one of multiple different data transmission protocols.

Figure 4:
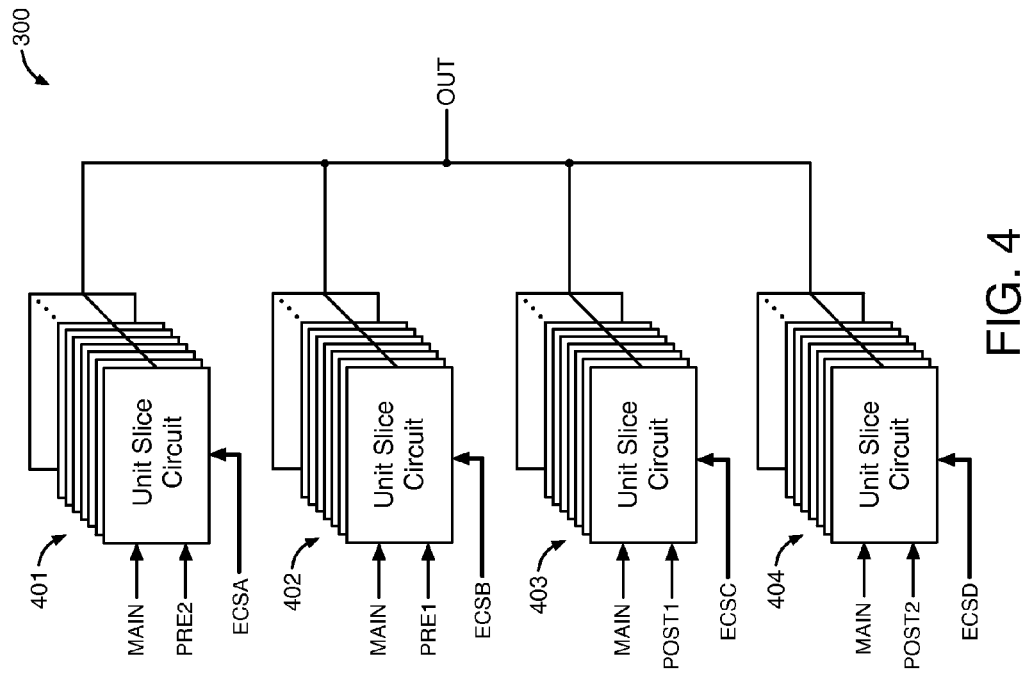
FIG. 4 illustrates another depiction of the output driver circuit of FIG. 3, according to an embodiment of the present invention.

FIG. 4 illustrates another depiction of output driver circuit 300, according to an embodiment of the present invention. In the embodiment of FIG. 4, the K number of unit slice circuits 310 in output driver circuit 300 are grouped into four subsets 401-404. Data signals MAIN and PRE2 are provided to inputs of each of the unit slice circuits in the first subset 401 as shown in FIG. 4. Data signals MAIN and PRE1 are provided to inputs of each of the unit slice circuits in the second subset 402. Data signals MAIN and POST1 are provided to inputs of each of the unit slice circuits in the third subset 403. Data signals MAIN and POST2 are provided to inputs of each of the unit slice circuits in the fourth subset 404. Thus, each of the four subsets 401-404 of the unit slice circuits 310 receives a different one of the data signals PRE2, PRE1, POST1, or POST2.

In the embodiment of FIG. 4, the emphasis control signals ECS are grouped into four subsets ECSA, ECSB, ECSC, and ECSD. The four subsets ECSA, ECSB, ECSC, and ECSD of control signals ECS are provided to the select inputs of the multiplexer circuits 301 in the four subsets 401, 402, 403, and 404, respectively, of the unit slice circuits 310, as shown in FIG. 4. The four subsets ECSA, ECSB, ECSC, and ECSD of the control signals ECS control multiplexer circuits 301 in the respective unit slice circuits 310, as described above with respect to FIG. 3.

The first subset ECSA of control signals ECS determines the number of the unit slice circuits 310 in the first subset 401 that generate data signal DSEL based on data signal MAIN. The first subset ECSA of control signals ECS also determines the number of the unit slice circuits 310 in the first subset 401 that generate data signal DSEL based on data signal PRE2. As an example, the first subset ECSA of control signals ECS may cause one or more of the unit slice circuits 310 in the first subset 401 to generate data signal DSEL based on data signal MAIN and one or more of the unit slice circuits 310 in the first subset 401 to generate data signal DSEL based on data signal PRE2. As another example, the first subset ECSA of control signals ECS may cause all of the unit slice circuits 310 in the first subset 401 to generate data signal DSEL based on data signal MAIN. As yet another example, the first subset ECSA of control signals ECS may cause all of the unit slice circuits 310 in the first subset 401 to generate data signal DSEL based on data signal PRE2.

If the first subset ECSA of control signals ECS cause any of the unit slice circuits 310 in the first subset 401 to generate data signal DSEL based on data signal PRE2, these unit slice circuits in the first subset 401 may be configured to add pre-emphasis to output signal OUT based on data signal PRE2. Output driver circuit 300 may use the second pre-tap signal PRE2 to de-emphasize the two bits before each logic state transition in data signal OUT and to emphasize the remaining bits in data signal OUT. In an alternative embodiment, the delay circuits invert the logic state of each of the bits in the second pre-tap signal PRE2 relative to the input data signal. Output driver circuit 300 may use the inverted second pre-tap signal PRE2 to emphasize the two bits before each logic state transition in data signal OUT and to de-emphasize the remaining bits in data signal OUT.

The second subset ECSB of control signals ECS determines the number of the unit slice circuits 310 in the second subset 402 that generate data signal DSEL based on data signal MAIN. The second subset ECSB of control signals ECS also determines the number of the unit slice circuits 310 in the second subset 402 that generate data signal DSEL based on data signal PRE1. As an example, the second subset ECSB of control signals ECS may cause one or more of the unit slice circuits 310 in the second subset 402 to generate data signal DSEL based on data signal MAIN and one or more of the unit slice circuits 310 in the second subset 402 to generate data signal DSEL based on data signal PRE1. As another example, the second subset ECSB of control signals ECS may cause all of the unit slice circuits 310 in the second subset 402 to generate data signal DSEL based on data signal MAIN. As yet another example, the second subset ECSB of control signals ECS may cause all of the unit slice circuits 310 in the second subset 402 to generate data signal DSEL based on data signal PRE1.

If the second subset ECSB of control signals ECS cause any of the unit slice circuits 310 in the second subset 402 to generate data signal DSEL based on data signal PRE1, these unit slice circuits 310 in the second subset 402 may be configured to add pre-emphasis to output signal OUT based on data signal PRE1. Output driver circuit 300 may use the first pre-tap signal PRE1 to de-emphasize the bit before each logic state transition in data signal OUT and to emphasize the remaining bits in data signal OUT. In an alternative embodiment, the delay circuits invert the logic state of each of the bits in the first pre-tap signal PRE1 relative to the input data signal. Output driver circuit 300 may use the inverted first pre-tap signal PRE1 to emphasize the bit before each logic state transition in data signal OUT and to de-emphasize the remaining bits in data signal OUT. Output driver circuit 300 may use one or both of the pre-tap signals PRE1 and PRE2 to add pre-emphasis to data signal OUT in order to reduce the pre-cursor ISI effect caused by one or more of the next bits in the data signal OUT.

The third subset ECSC of control signals ECS determines the number of the unit slice circuits 310 in the third subset 403 that generate data signal DSEL based on data signal MAIN. The third subset ECSC of control signals ECS also determines the number of the unit slice circuits 310 in the third subset 403 that generate data signal DSEL based on data signal POST1. As an example, the third subset ECSC of control signals ECS may cause one or more of the unit slice circuits 310 in the third subset 403 to generate data signal DSEL based on data signal MAIN and one or more of the unit slice circuits 310 in the third subset 403 to generate data signal DSEL based on data signal POST1. As another example, the third subset ECSC of control signals ECS may cause all of the unit slice circuits 310 in the third subset 403 to generate data signal DSEL based on data signal MAIN. As yet another example, the third subset ECSC of control signals ECS may cause all of the unit slice circuits 310 in the third subset 403 to generate data signal DSEL based on data signal POST1.

If the third subset ECSC of control signals ECS cause any of the unit slice circuits 310 in the third subset 403 to generate data signal DSEL based on data signal POST1, these unit slice circuits 310 in the third subset 403 may be configured to add de-emphasis to output data signal OUT based on data signal POST1. Output driver circuit 300 may use the first post-tap data signal POST1 to emphasize the first bit that is after each logic state transition in data signal OUT and to de-emphasize the remaining bits in data signal OUT. In an alternative embodiment, the delay circuits invert the logic state of each of the bits in the first post-tap signal POST1 relative to the input data signal. Output driver circuit 300 may use the inverted first post-tap signal POST1 to de-emphasize the first bit after each logic state transition in data signal OUT and to emphasize the remaining bits in data signal OUT.

The fourth subset ECSD of control signals ECS determines the number of the unit slice circuits 310 in the fourth subset 404 that generate data signal DSEL based on data signal MAIN. The fourth subset ECSD of control signals ECS also determines the number of the unit slice circuits 310 in the fourth subset 404 that generate data signal DSEL based on data signal POST2. As an example, the fourth subset ECSD of control signals ECS may cause one or more of the unit slice circuits 310 in the fourth subset 404 to generate data signal DSEL based on data signal MAIN and one or more of the unit slice circuits 310 in the fourth subset 404 to generate data signal DSEL based on data signal POST2. As another example, the fourth subset ECSD of control signals ECS may cause all of the unit slice circuits 310 in the fourth subset 404 to generate data signal DSEL based on data signal MAIN. As yet another example, the fourth subset ECSD of control signals ECS may cause all of the unit slice circuits 310 in the fourth subset 404 to generate data signal DSEL based on data signal POST2.

If the fourth subset ECSD of control signals ECS cause any of the unit slice circuits 310 in the fourth subset 404 to generate data signal DSEL based on data signal POST2, these unit slice circuits 310 in the fourth subset 404 may be configured to add de-emphasis to output data signal OUT based on data signal POST2. Output driver circuit 300 may use the second post-tap signal POST2 to de-emphasize the first two bits after each logic state transition in data signal OUT and to emphasize the remaining bits in data signal OUT. In an alternative embodiment, the delay circuits invert the logic state of each of the bits in the second post-tap signal POST2 relative to the input data signal. Output driver circuit 300 may use the inverted second post-tap signal POST2 to emphasize the first two bits after each logic state transition in data signal OUT and to de-emphasize the remaining bits in data signal OUT. Output driver circuit 300 may use one or both of the post-tap signals POST1 and POST2 to add de-emphasis to data signal OUT in order to reduce the post-cursor ISI effect caused by one or more of the previous bits in data signal OUT.

The ratio of the number of unit slice circuits 310 that add pre-emphasis or de-emphasis to output data signal OUT relative to the number of unit slice circuits 310 that generate output data signal OUT based on data signal MAIN determine the normalized emphasis coefficient C. If an M number of the unit slice circuits 310 generate output data signal OUT based on data signal MAIN, and an N number of the unit slice circuits 310 generate output data signal OUT based on one of data signals PRE2, PRE1, POST, or POST2, then the normalized emphasis coefficient C equals N/K for the respective signal PRE2, PRE1, POST1, or POST2. The voltage change $V_{CH}$ that one of signals PRE2, PRE1, POST, or POST2 generates in output data signal OUT as measured in decibels (dB) is shown below in equation (1). In equation (1), C=N/K, and N is the number of the unit slice circuits 310 providing emphasis to output data signal OUT based on one of signals PRE2, PRE1, POST, or POST2. Equation (1) can be used to determine the voltage change $V_{CH}$ that each of signals PRE2, PRE1, POST, and POST2 generates in output data signal OUT by using the respective values for N and C.

$$V_{CH}(dB)=20\times\log_{10}(1-(2>C/K)) \quad (1)$$

As shown in equation (1), increasing the number of unit slice circuits 310 that provide emphasis to output data signal OUT based on one of data signals PRE2, PRE1, POST1, or POST2 increases the voltage change in output data signal OUT caused by the respective data signal PRE2, PRE1, POST1, or POST2. Conversely, decreasing the number of unit slice circuits 310 that provide emphasis to output data signal OUT based on one of data signals PRE2, PRE1, POST1, or POST2 decreases the voltage change in output data signal OUT caused by the respective data signal PRE2, PRE1, POST1, or POST2. The voltage of each bit in output data signal OUT is the result of combining all five input data signals PRE2, PRE1, MAIN, POST1, and POST2 for the respective bit adjusted by the percentage of unit slice circuits 310 that use each respective one of these five input data signals to generate output data signal OUT.

Some data transmission protocols support a reduced voltage swing in the transmitted data signal OUT. A programmable voltage regulator can be used to reduce the supply voltage VCC in order to reduce the voltage swing of output data signal OUT. However, a programmable voltage regulator may not be able to reduce the voltage swing of output data signal OUT to satisfy the requirements of some data transmission protocols. Turning off one or more of the unit slice circuits in order to reduce the voltage swing of the output data signal of the output driver circuit changes the total termination resistance at the output of the output driver circuit, which may be undesirable.

According to some embodiments that are shown in and described below with respect to FIGS. 5-6, one or more of the unit slice circuits 310 in output driver circuit 300 are programmed to respond to one or more fixed input voltages, instead of responding to data signal DSEL. The fixed input unit slice circuits continuously provide constant current to and from the output data signal OUT. The fixed input unit slice circuits do not contribute to the dynamic current provided to the load at the output of output driver circuit 300. As a result, the fixed input unit slice circuits reduce the voltage swing of output data signal OUT. The fixed input unit slice circuits may reduce one or more of the peak voltage swing of output data signal OUT, the peak-to-peak voltage swing of output data signal OUT, and/or the root mean square (RMS) voltage swing of output data signal OUT. Causing one or more of the unit slice circuits to have a constant output current does not change the total termination resistance at the output of output driver circuit 300.

Figure 5:
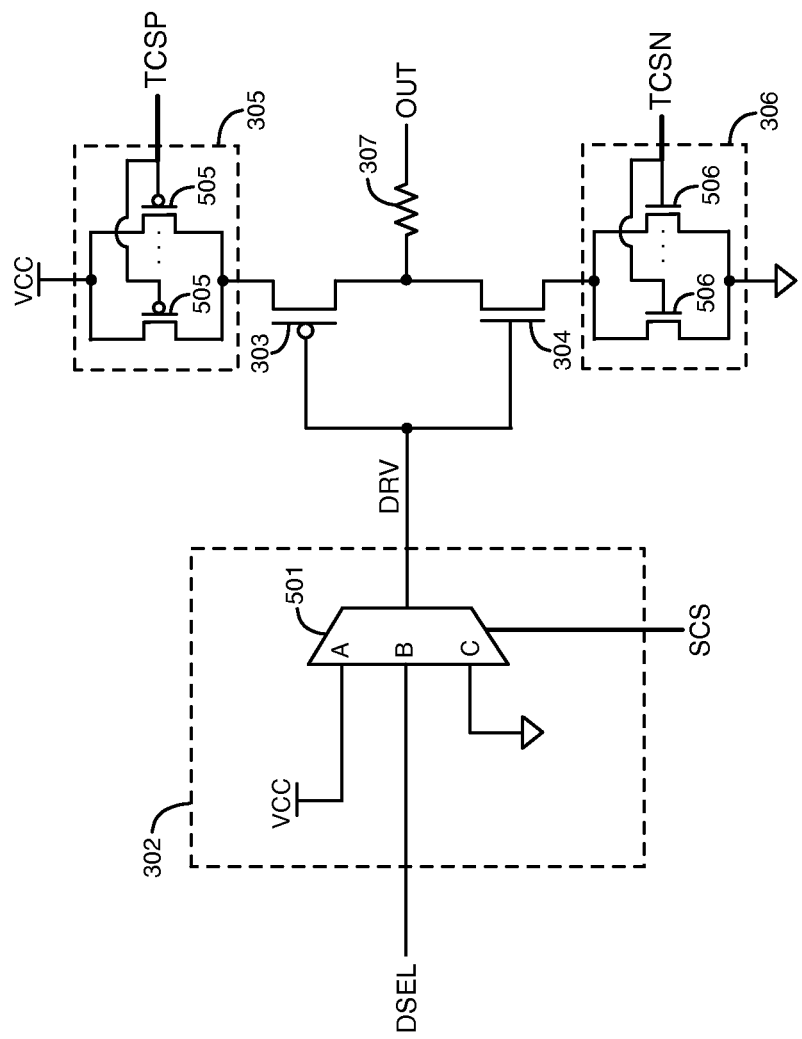
FIG. 5 illustrates further details of the slice control circuit and the adjustable resistor circuits in the output driver circuit of FIG. 3, according to an embodiment of the present invention.

FIG. 5 illustrates further details of slice control circuit 302 and adjustable resistor circuits 305-306, according to an embodiment of the present invention. In the embodiment of FIG. 5, slice control circuit 302 includes a multiplexer circuit 501. Multiplexer circuit 301 generates data signal DSEL as discussed above with respect to FIG. 3. Data signal DSEL is provided to the B multiplexing input of multiplexer circuit 501. The ground voltage is provided to the C multiplexing input of multiplexer circuit 501. The supply voltage VCC is provided to the A multiplexing input of multiplexer circuit 501. Respective ones of the slice control signals SCS are provided to the select inputs of multiplexer circuit 501 in each of the unit slice circuits 310.

In response to the respective ones of the slice control signals SCS having a first set of values, multiplexer circuit 501 drives the voltage of signal DRV to the supply voltage VCC. The supply voltage VCC remains at a substantially constant fixed voltage during the operation of driver circuit 300. Although in some embodiments, supply voltage VCC may be adjusted using a programmable voltage regulator. When signal DRV is at the supply voltage VCC, p-channel transistor 303 is off, and n-channel transistor 304 is on, continuously draining a constant current from the output data signal OUT through resistor 307 and adjustable resistor circuit 306 to the ground rail at the ground voltage.

In response to the respective ones of the slice control signals SCS having a second set of values, multiplexer circuit 501 provides the bits indicated by data signal DSEL to the gates of p-channel transistor 303 and n-channel transistor 304 in signal DRV. In response to data signal DSEL being in a logic high state, multiplexer circuit 501 drives signal DRV to a logic high state, causing transistor 303 to be off and transistor 304 to be on. When transistor 304 is on, transistor 304 drains current from the output data signal OUT to the ground rail through resistor 307 and adjustable resistor 306. In response to data signal DSEL being in a logic low state, multiplexer circuit 501 drives signal DRV to a logic low state, causing transistor 303 to be on and transistor 304 to be off. When transistor 303 is on, transistor 303 provides current from the supply rail to the output data signal OUT through adjustable resistor 305 and resistor 307. In this way, the unit slice circuit provides current to and from output data signal OUT based on the bits in data signal DSEL when the respective ones of the slice control signals SCS have the second set of values.

In response to the respective ones of the slice control signals SCS having a third set of values, multiplexer circuit 501 drives the voltage of signal DRV to the ground voltage. The ground voltage remains at a substantially constant fixed voltage during the operation of driver circuit 300. When signal DRV is at the ground voltage, n-channel transistor 304 is off, and p-channel transistor 303 is on, continuously drawing a constant current from the supply rail at VCC through adjustable resistor 305 and resistor 307 to the output data signal OUT.

The values of the slice control signals SCS may be set to cause one or more of the unit slice circuits 310 in output driver circuit 300 to generate a constant current to the output data signal OUT in response to the supply voltage VCC, instead of data signal DSEL. The values of the slice control signals SCS may also be set to cause one or more of the unit slice circuits 310 in output driver circuit 300 to generate a constant current from the output data signal OUT in response to the ground voltage, instead of data signal DSEL. Because these fixed input unit slice circuits continuously provide a constant current to and from the output data signal OUT, the fixed input unit slice circuits do not contribute to the dynamic current at the output of output driver circuit 300. Causing one or more of the unit slice circuits 310 to provide a constant current to or from output data signal OUT reduces the voltage swing of output data signal OUT. Causing one or more of the unit slice circuits 310 to provide a constant current to or from output data signal OUT does not change the total termination resistance at the output of output driver circuit 300.

FIG. 5 also shows further details of adjustable resistor circuits 305-306. As shown in FIG. 5, adjustable resistor circuit 305 includes two or more p-channel transistors 505 coupled together in parallel. Adjustable resistor circuit 306 includes two or more n-channel transistors 506 coupled together in parallel. Transistors 505 and transistors 506 may be, for example, MOSFETs.

Termination control signals TCSP control the gate voltages of p-channel transistors 505. The conductive state of each of the p-channel transistors 505 is controlled by a different one of termination control signals TCSP. The values of termination control signals TCSP are changed to turn on or turn off different ones of p-channel transistors 505 to adjust the resistance of adjustable resistor circuit 305. The resistance of adjustable resistor 305 may be adjusted to change the termination resistance of the unit slice circuit. Transistors 505 may, for example, have binary weighted width-to-length channel ratios.

Termination control signals TCSN control the gate voltages of n-channel transistors 506. The conductive state of each of the n-channel transistors 506 is controlled by a different one of the termination control signals TCSN. The values of termination control signals TCSN are changed to turn on or turn off different ones of n-channel transistors 506 to adjust the resistance of adjustable resistor circuit 306. The resistance of adjustable resistor 306 may be adjusted to change the termination resistance of the unit slice circuit. Transistors 506 may, for example, have binary weighted width-to-length channel ratios.

Figure 6:
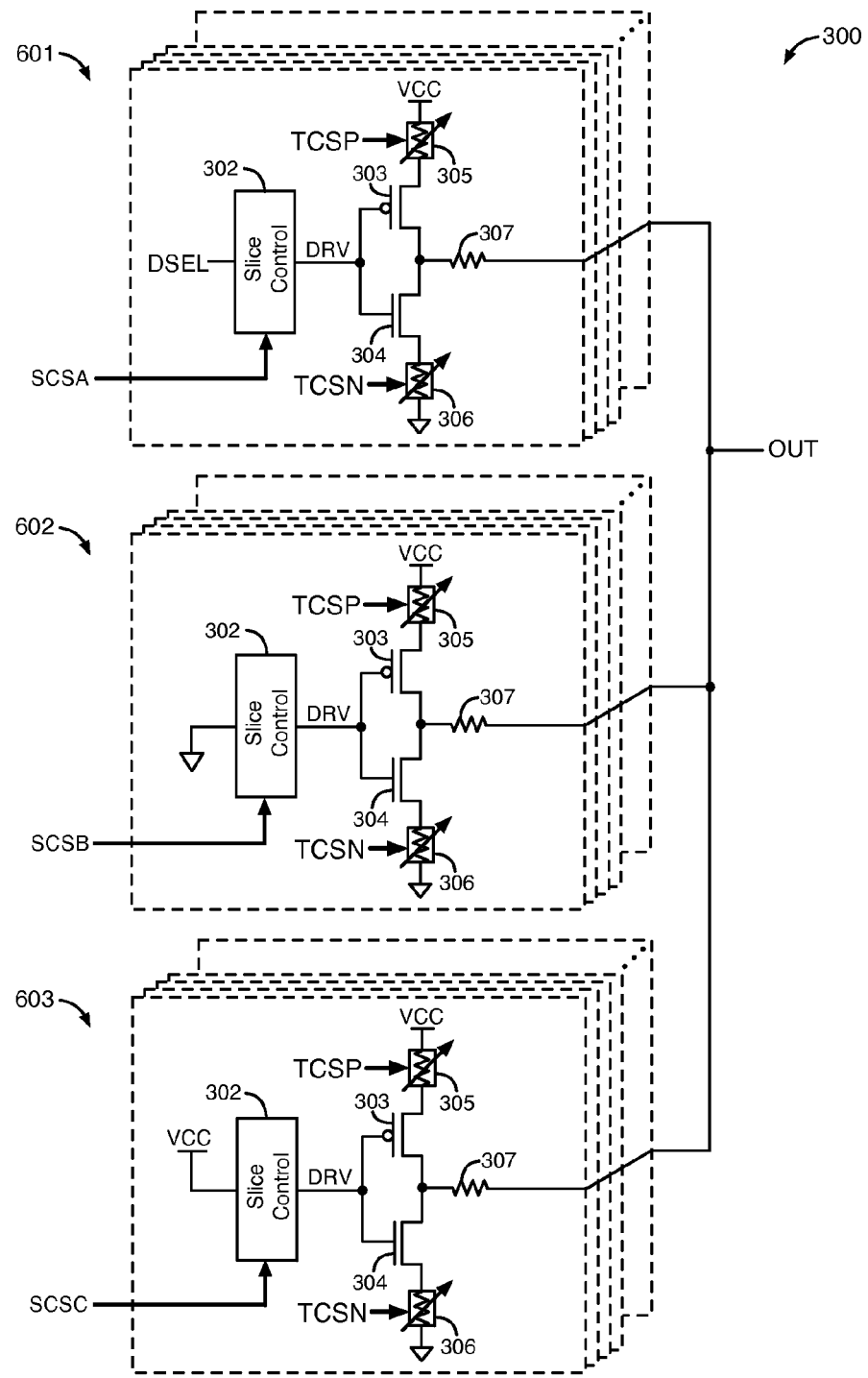
FIG. 6 illustrates an example of the output driver circuit of FIG. 3 having a subset of the unit slice circuits that provide constant current to and from the output data signal, according to an embodiment of the present invention.

FIG. 6 illustrates an example of output driver circuit 300 having a subset of the unit slice circuits that provide constant current to and from the output data signal OUT, according to an embodiment of the present invention. FIG. 6 illustrates a first subset 601 of the unit slice circuits 310 in output driver circuit 300. Slice control circuit 302 in each of the unit slice circuits in the first subset 601 of unit slice circuits 310 shown in FIG. 6 is configured by a first set of the slice control signals SCSA to generate signal DRV based on a respective one of the data signals DSEL. Each of the unit slice circuits in the first subset 601 of unit slice circuits 310 is configured to provide current to and from the output data signal OUT based on bits in a respective one of the data signals DSEL, as described above with respect to FIG. 5. Each of the data signals DSEL is generated based on one of data signals MAIN, PRE1, PRE2, POST1, or POST2, as described above with respect to FIGS. 3-4.

FIG. 6 also illustrates a second subset 602 of the unit slice circuits 310 in output driver circuit 300. Slice control circuit 302 in each of the unit slice circuits in the second subset 602 of unit slice circuits 310 shown in FIG. 6 is configured by a second set of the slice control signals SCSB to generate signal DRV based on the ground voltage. An example of generating signal DRV based on the ground voltage is described above with respect to FIG. 5. Each of the unit slice circuits in the second subset 602 of unit slice circuits 310 provides constant current to the output data signal OUT from the supply rail. The unit slice circuits in the second subset 602 do not change the total termination resistance at the output of output driver circuit 300, because each of the unit slice circuits in the second subset 602 provides constant current to the output data signal OUT of output driver circuit 300.

FIG. 6 also illustrates a third subset 603 of the unit slice circuits 310 in output driver circuit 300. Slice control circuit 302 in each of the unit slice circuits in the third subset 603 of unit slice circuits 310 shown in FIG. 6 is configured by a third set of the slice control signals SCSC to generate signal DRV based on the supply voltage VCC. An example of generating signal DRV based on the supply voltage VCC is described above with respect to FIG. 5. Each of the unit slice circuits in the third subset 603 of unit slice circuits 310 provides constant current from the output data signal OUT to the ground rail. The unit slice circuits in the third subset 603 do not change the total termination resistance at the output of output driver circuit 300, because each of the unit slice circuits in the third subset 603 provides constant current from the output data signal OUT of output driver circuit 300.

Output driver circuit 300 adjusts the voltage swing of output data signal OUT without affecting the termination resistance at its output in response to the number of the unit slice circuits in the first, second, and third subsets 601-603 being changed. Output driver circuit 300 reduces the voltage swing of output data signal OUT without affecting the termination resistance at its output in response to the number of the unit slice circuits in the first subset 601 being decreased and the number of the unit slice circuits in each of the second and third subsets 602-603 being increased. Output driver circuit 300 increases the voltage swing of output data signal OUT without affecting the termination resistance at its output in response to the number of the unit slice circuits in the first subset 601 being increased and the number of the unit slice circuits in each of the second and third subsets 602-603 being decreased. The number of unit slice circuits in the first subset 601 and the number of unit slice circuits in the second and third subsets 602-603 can be changed by changing the values of respective ones of the control signals SCS, as described above with respect to FIG. 5. In an embodiment, the number of unit slice circuits in the second subset 602 equals the number of unit slice circuits in the third subset 603.

The unit slice circuits in the second and third subsets 602-603 of unit slice circuits 310 reduce the voltage swing of output data signal OUT. For example, if there are a K number of unit slice circuits 310 in output driver circuit 300, an X number of unit slice circuits in the second subset 602 of unit slice circuits 310, an X number of unit slice circuits in the third subset 603 of unit slice circuits 310, and a K−2 X number of unit slice circuits in the first subset 601 of the unit slice circuits 310, then the peak-to-peak voltage swing $V_{SW}$ of output data signal OUT is shown by equation (2) below.

$$V_{SW} = VCC \times (K-2X)/(K-X) \qquad (2)$$

In the embodiment represented by equation (2), the number X of unit slice circuits in the second subset 602 equals the number X of unit slice circuits in the third subset 603. If the number of unit slice circuits in both the second and third subsets 602-603 of unit slice circuits 310 equals zero, the peak-to-peak voltage swing $V_{SW}$ of output data signal OUT equals the supply voltage VCC. The number of unit slice circuits in the second and third subsets 602-603 that have constant currents can be increased to decrease the peak-to-peak voltage swing $V_{SW}$ of output data signal OUT. The number 2 X of unit slice circuits in the second and third subsets 602-603 that have constant currents can be selected using equation (2) to provide a desired peak-to-peak voltage swing $V_{SW}$ in output data signal OUT between zero volts and supply voltage VCC. Increasing the number of unit slice circuits in the second and third subsets 602-603 may increase the total power consumption of output driver circuit 300, because the unit slice circuits in the second and third subsets 602-603 continuously draw current during operation.

Figure 7B:
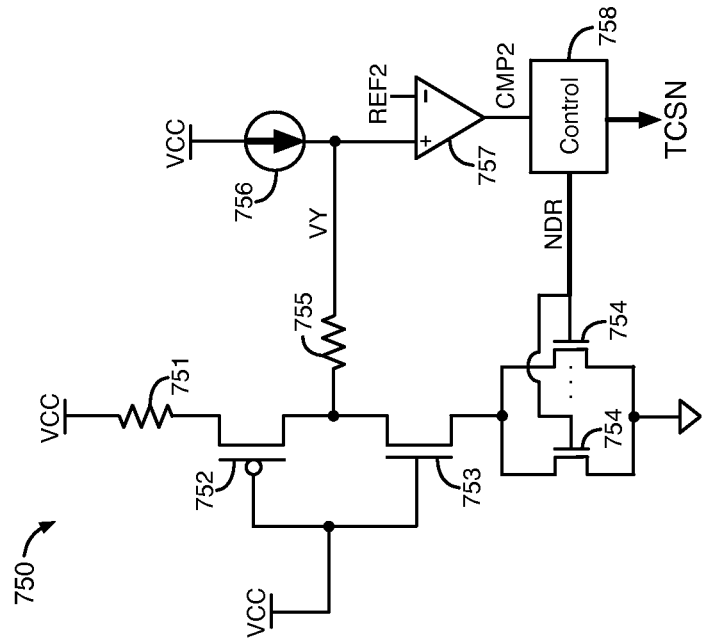
FIG. 7B illustrates an on-chip termination calibration circuit for the n-channel transistors in the adjustable resistor circuits in the output driver circuit of FIG. 3, according to an embodiment of the present invention.
Figure 7A:
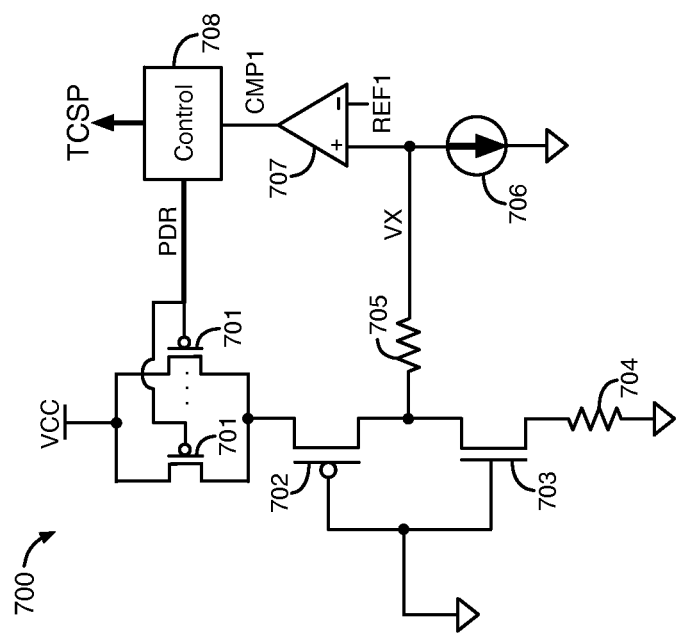
FIG. 7A illustrates an on-chip termination calibration circuit for the p-channel transistors in the adjustable resistor circuits in the output driver circuit of FIG. 3, according to an embodiment of the present invention.

FIG. 7A illustrates an on-chip termination calibration circuit 700 for the p-channel transistors in adjustable resistor circuits 305 in output driver circuit 300, according to an embodiment of the present invention. On-chip termination (OCT) calibration circuit 700 includes p-channel transistors 701, p-channel transistor 702, re-channel transistor 703, resistors 704-705, constant current source circuit 706, comparator circuit 707, and control circuit 708. Transistors 701-703 may be MOSFETs. OCT calibration circuit 700 may, for example, be located in output driver circuit 300 or next to output driver circuit 300 on the same integrated circuit.

Two or more p-channel transistors 701 are coupled in parallel between the supply rail at supply voltage VCC and the source of p-channel transistor 702. Control circuit 708 generates a set of control signals PDR. Each of the control signals PDR is provided to the gate of a unique one of p-channel transistors 701. The gates of transistors 702 and 703 are coupled to the ground rail at the ground voltage. As a result, transistor 702 is on, and transistor 703 is off. Current flows from the supply rail through one or more of transistors 701, transistor 702, resistor 705, and constant current source circuit 706 to the ground rail at the ground voltage.

Comparator circuit 707 compares the voltage VX between resistor 705 and current source circuit 706 to a constant reference voltage REF1 to generate a comparison signal CMP1 at its output. Comparison signal CMP1 is provided to an input of control circuit 708. According to an exemplary embodiment, only one of transistors 701 is on initially during calibration, the remaining transistors 701 are off, and the comparison signal CMP1 indicates that voltage VX is less than reference voltage REF1. Control circuit 708 adjusts control signals PDR to cause more of p-channel transistors 701 to turn on until the comparison signal CMP1 changes state indicating that voltage VX equals or exceeds reference voltage REF1.

After the comparison signal CMP1 changes state, control circuit 708 generates the termination control signals TCSP based on the current values of the control signals PDR. Termination control signals TCSP control the resistance of the adjustable resistor circuit 305 in each of the unit slice circuits 310 in output driver circuit 300, as described above. In the embodiment of FIG. 5, termination control signals TCSP control the conductive states of transistors 505. In this embodiment, transistors 505 in each adjustable resistor circuit 305 have the same width-to-length channel ratios as corresponding ones of transistors 701. Resistor 705 has the same resistance as the resistor 307 in each unit slice circuit. P-channel transistor 702 has the same width-to-length channel ratio as the p-channel transistor 303 in each unit slice circuit.

The reference voltage REF1 is selected to be a voltage that causes the combined resistance of transistors 701 to have a predefined value when voltage VX equals reference voltage REF1. Control circuit 708 determines the values of the termination control signals TCSP based on the values of the control signals PDR, based on the predefined value of the combined resistance of transistors 701, based on the number K of unit slice circuits 310 in output driver circuit 300, and based on the characteristic impedance of the transmission line coupled to output driver circuit 300. Control circuit 708 generates values for termination control signals TCSP that cause the unit slice circuits 310 to provide a termination resistance at the output of output driver circuit 300 that matches the characteristic impedance of the transmission line coupled to output driver circuit 300.

FIG. 7B illustrates an on-chip termination calibration circuit 750 for the re-channel transistors in adjustable resistor circuits 306 in output driver circuit 300, according to an embodiment of the present invention. On-chip termination (OCT) calibration circuit 750 includes resistor 751, p-channel transistor 752, n-channel transistor 753, n-channel transistors 754, resistor 755, constant current source circuit 756, comparator circuit 757, and control circuit 758. Transistors 752-754 may be MOSFETs. OCT calibration circuit 750 may, for example, be located in output driver circuit 300 or next to output driver circuit 300 on the same integrated circuit.

Two or more n-channel transistors 754 are coupled in parallel between the source of n-channel transistor 753 and the ground rail at the ground voltage. Control circuit 758 generates a set of control signals NDR. Each of the control signals NDR is provided to the gate of a unique one of n-channel transistors 754. The gates of transistors 752 and 753 are coupled to the supply rail at supply voltage VCC. As a result, transistor 752 is off, and transistor 753 is on. Current flows from the supply rail through constant current source circuit 756, resistor 755, transistor 753, and one or more of transistors 754 to the ground rail at the ground voltage.

Comparator circuit 757 compares the voltage VY between resistor 755 and current source circuit 756 to a constant reference voltage REF2 to generate a comparison signal CMP2 at its output. Comparison signal CMP2 is provided to an input of control circuit 758. According to an exemplary embodiment, only one of transistors 754 is on initially during calibration, the remaining transistors 754 are off, and the comparison signal CMP2 indicates that voltage VY is greater than reference voltage REF2. Control circuit 758 adjusts control signals NDR to cause more of n-channel transistors 754 to turn on until the comparison signal CMP2 changes state indicating that voltage VY is equal to or less than reference voltage REF2.

After the comparison signal CMP2 changes state, control circuit 758 generates the termination control signals TCSN based on the current values of the control signals NDR. Termination control signals TCSN control the resistance of the adjustable resistor circuit 306 in each of the unit slice circuits 310 in output driver circuit 300, as described above. In the embodiment of FIG. 5, termination control signals TCSN control the conductive states of transistors 506. In this embodiment, transistors 506 in each adjustable resistor circuit 306 have the same width-to-length channel ratios as corresponding ones of transistors 754. Resistor 755 has the same resistance as the resistor 307 in each unit slice circuit. N-channel transistor 753 has the same width-to-length channel ratio as the re-channel transistor 304 in each unit slice circuit. Current source circuit 756 may generate the same constant current as current source circuit 706.

The reference voltage REF2 is selected to be a voltage that causes the combined resistance of transistors 754 to have a predefined value when voltage VY equals reference voltage REF2. Control circuit 758 determines the values of the termination control signals TCSN based on the values of the control signals NDR, based on the predefined value of the combined resistance of transistors 754, based on the number K of unit slice circuits 310 in output driver circuit 300, and based on the characteristic impedance of the transmission line coupled to output driver circuit 300. Control circuit 758 generates values for termination control signals TCSN that cause the unit slice circuits 310 to provide a termination resistance at the output of output driver circuit 300 that matches the characteristic impedance of the transmission line coupled to output driver circuit 300.

In some embodiments, two, three, four, or more OCT calibration circuits 700 are used to generate control signals TCSP, and two, three, four, or more OCT calibration circuits 750 are used to generate control signals TCSN. In these embodiments, the values of the control signals PDR generated by the OCT calibration circuits 700 are averaged together to generate control signals TCSP. The values of the control signals NDR generated by the OCT calibration circuits 750 are averaged together to generate control signals TCSN.

Figure 8:
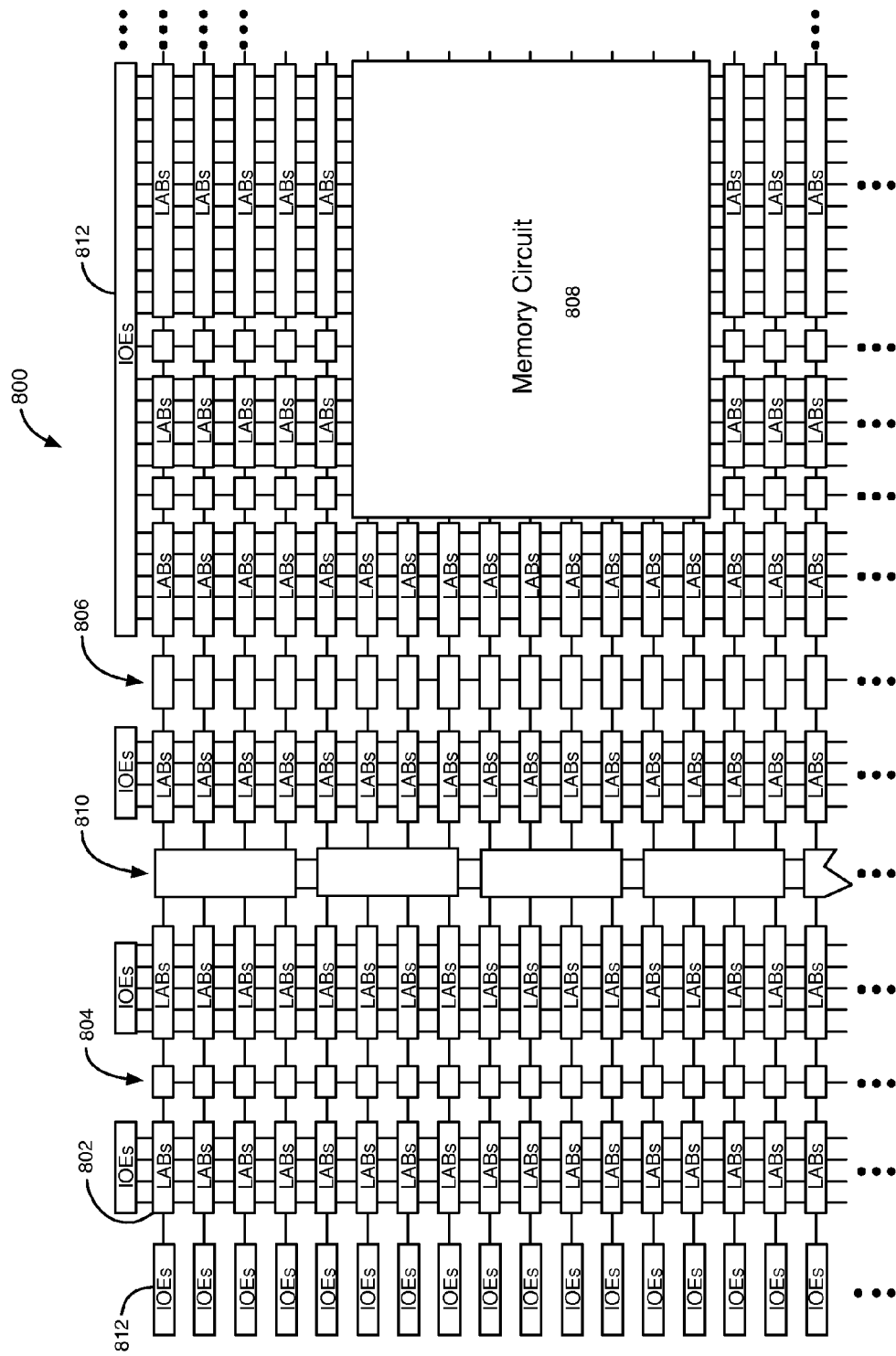
FIG. 8 is a simplified partial block diagram of a field programmable gate array (FPGA) that can include aspects of the present invention.

FIG. 8 is a simplified partial block diagram of a field programmable gate array (FPGA) 800 that can include aspects of the present invention. FPGA 800 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 800 includes a two-dimensional array of programmable logic array blocks (or LABs) 802 that are interconnected by a network of column and row interconnect conductors of varying length and speed. LABs 802 include several logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure of interconnect conductors. The programmable interconnect structure can be programmed to interconnect the logic elements in almost any desired configuration.

FPGA 800 may also include a distributed memory structure including random access memory (RAM) circuits of varying sizes provided throughout the array. The RAM circuits include, for example, circuits 804, circuits 806, and circuit 808. These memory circuits can also include shift registers and first-in first-out (FIFO) circuits.

FPGA 800 may further include digital signal processing (DSP) circuits 810 that can implement, for example, multipliers with add or subtract features. Input/output elements (IOEs) 812 support numerous single-ended and differential input/output standards. IOEs 812 may include receiver circuits and transmitter circuits, such as transmitter circuits 111 and 161. The transmitter and receiver circuits are coupled to pads of the integrated circuit. The pads are external terminals of the FPGA die that can be used to route, for example, input signals, output signals, and supply voltages between the FPGA and one or more external devices. FPGA 800 is described herein for illustrative purposes. Embodiments of the present invention can be implemented in many different types of integrated circuits.

Figure 9:
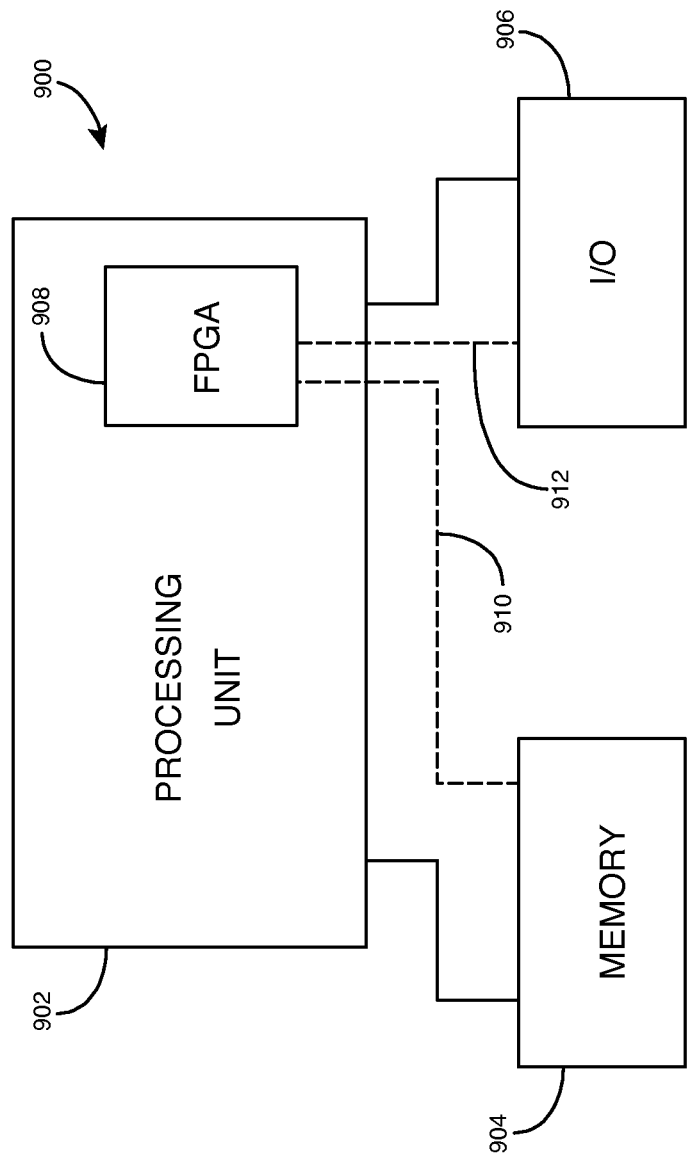
FIG. 9 shows a block diagram of an exemplary digital system that can embody techniques of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor that can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing discussion of the exemplary embodiments of the present invention has been presented for the purposes of illustration and description. The foregoing discussion is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A driver circuit comprising:
   a first subset of unit slice circuits that generate an output data signal based on an input data signal; and
   a second subset of unit slice circuits that generate constant current affecting a voltage swing of the output data signal based on a fixed voltage, wherein the driver circuit reduces the voltage swing of the output data signal without changing a termination resistance of the driver circuit in response to decreasing a number of the unit slice circuits in the first subset that generate the output data signal based on the input data signal and in response to increasing a number of the unit slice circuits in the second subset.

2. The driver circuit of claim 1, wherein each of the unit slice circuits in the first subset of unit slice circuits comprises:
   a multiplexer circuit, wherein the multiplexer circuit in each unit slice circuit in a first subgroup of the unit slice circuits in the first subset generates a selected signal based on a selected one of a first input data signal or a second input data signal, wherein the multiplexer circuit in each unit slice circuit in a second subgroup of the unit slice circuits in the first subset generates a selected signal based on a selected one of the second input data signal or a third input data signal, wherein each of the unit slice circuits in the first subset generates the output data signal based on the selected signal generated by the multiplexer circuit in that unit slice circuit,
   wherein the driver circuit further comprises delay circuits to delay the second input data signal relative to the first input data signal, and wherein the delay circuits delay the third input data signal relative to the second input data signal.

3. The driver circuit of claim 1, wherein the unit slice circuits in the second subset generate constant current that affects the voltage swing of the output data signal based on a first fixed voltage, and wherein the driver circuit further comprises unit slice circuits in a third subset that generate constant current affecting the voltage swing of the output data signal based on a second fixed voltage.

4. The driver circuit of claim 1, wherein each of the unit slice circuits in the first and second subsets comprises:
   a slice control circuit to generate a drive signal based on the input data signal or the fixed voltage in response to a control signal;
   a first transistor to receive the drive signal at a control input; and
   a second transistor to receive the drive signal at a control input, wherein the first and second transistors are coupled to an output of the driver circuit.

5. The driver circuit of claim 4, wherein the slice control circuit in each of the unit slice circuits in the first subset comprises a multiplexer circuit to generate the drive signal based on the input data signal, wherein the slice control circuit in each of the unit slice circuits in the second subset comprises a multiplexer circuit to generate the drive signal based on a ground voltage, wherein the driver circuit further comprises unit slice circuits in a third subset, and wherein the slice control circuit in each of the unit slice circuits in the third subset comprises a multiplexer circuit to generate the drive signal based on a supply voltage.

6. The driver circuit of claim 4, wherein each of the unit slice circuits in the first and second subsets further comprises:
   a first adjustable resistor circuit coupled to the first transistor, the first adjustable resistor circuit to provide termination resistance at the output of the driver circuit when the first transistor is on; and
   a second adjustable resistor circuit coupled to the second transistor, the second adjustable resistor circuit to provide termination resistance at the output of the driver circuit when the second transistor is on.

7. The driver circuit of claim 1, wherein each of the unit slice circuits in the first subset of unit slice circuits comprises:
   a multiplexer circuit, wherein the multiplexer circuit in each unit slice circuit in a first subgroup of the unit slice circuits in the first subset receives first and second input data signals at multiplexing inputs, wherein the multiplexer circuit in each unit slice circuit in a second subgroup of the unit slice circuits in the first subset receives the second input data signal and a third input data signal at multiplexing inputs,
   wherein the driver circuit further comprises delay circuits to delay the second input data signal by one unit interval relative to the first input data signal, and wherein the delay circuits delay the third input data signal by one unit interval relative to the second input data signal.

8. The driver circuit of claim 7, wherein the multiplexer circuit in each unit slice circuit in a third subgroup of the unit slice circuits in the first subset receives the second input data signal and a fourth input data signal at multiplexing inputs, wherein the delay circuits delay the fourth input data signal by one unit interval relative to the third input data signal, wherein the multiplexer circuit in each unit slice circuit in a fourth subgroup of the unit slice circuits in the first subset receives the second input data signal and a fifth input data signal at multiplexing inputs, and wherein the delay circuits delay the first input data signal by one unit interval relative to the fifth input data signal.

9. The driver circuit of claim 1, wherein the driver circuit increases the voltage swing of the output data signal without changing the termination resistance of the driver circuit in response to increasing the number of the unit slice circuits in the first subset and decreasing the number of the unit slice circuits in the second subset.

10. The driver circuit of claim 1, wherein the driver circuit is a voltage mode driver circuit.

11. The driver circuit of claim 1, wherein the unit slice circuits in the second subset provide constant current to an output of the driver circuit in response to a ground voltage, wherein the driver circuit further comprises unit slice circuits in a third subset, and wherein the unit slice circuits in the third subset provide constant current from the output of the driver circuit in response to a supply voltage.

12. A driver circuit comprising unit slice circuits, wherein each of the unit slice circuits comprises:
   a slice control circuit to generate a drive signal;
   a first transistor to receive the drive signal at a control input; and
   a second transistor to receive the drive signal at a control input,
   wherein the first and second transistors in a first subset of the unit slice circuits generate an output data signal based on an input data signal, and wherein the first and second transistors in a second subset of the unit slice circuits generate constant current that affects a voltage amplitude of the output data signal based on a fixed voltage.

13. The driver circuit of claim 12, wherein the driver circuit reduces the voltage amplitude of the output data signal without affecting a termination resistance of the driver circuit in response to decreasing a number of the unit slice circuits in the first subset and increasing a number of the unit slice circuits in the second subset.

14. The driver circuit of claim 13, wherein the driver circuit decreases the number of the unit slice circuits in the first subset and increases the number of the unit slice circuits in the second subset in response to a change in a control signal provided to the slice control circuit in at least one of the unit slice circuits.

15. The driver circuit of claim 12, wherein the slice control circuit in each of the unit slice circuits in the first subset comprises a multiplexer circuit to generate the drive signal based on the input data signal, wherein the slice control circuit in each of the unit slice circuits in the second subset comprises a multiplexer circuit to generate the drive signal based on a low supply voltage, and wherein the slice control circuit in each of the unit slice circuits in a third subset of the unit slice circuits comprises a multiplexer circuit to generate the drive signal based on a high supply voltage.

16. The driver circuit of claim 12, wherein each of the unit slice circuits further comprises:
a multiplexer circuit, wherein the multiplexer circuit in each of the unit slice circuits in a first subgroup of the unit slice circuits selects one of first or second input data signals, and wherein the multiplexer circuit in each of the unit slice circuits in a second subgroup of the unit slice circuits selects one of the second input data signal or a third input data signal.

17. The driver circuit of claim 16 further comprising delay circuits to delay the second input data signal by one unit interval relative to the first input data signal, wherein the delay circuits delay the third input data signal by one unit interval relative to the second input data signal,
wherein the multiplexer circuit in each of the unit slice circuits in a third subgroup of the unit slice circuits selects one of the second input data signal or a fourth input data signal, and wherein the delay circuits delay the first input data signal by one unit interval relative to the fourth input data signal.

18. A method comprising:
generating an output data signal at an output of a driver circuit based on an input data signal using a first set of unit slice circuits in the driver circuit;
generating constant current that affects an amplitude of a voltage of the output data signal based on a substantially fixed voltage using a second set of unit slice circuits in the driver circuit; and
reducing the amplitude of the voltage of the output data signal without changing a termination resistance at the output of the driver circuit by decreasing a number of the unit slice circuits in the first set and increasing a number of the unit slice circuits in the second set.

19. The method of claim 18, wherein generating an output data signal at an output of a driver circuit based on an input data signal using a first set of unit slice circuits in the driver circuit comprises turning on and off transistors based on the input data signal using a slice control circuit in each of the unit slice circuits in the first set, and
wherein generating constant current that affects an amplitude of a voltage of the output data signal based on a substantially fixed voltage using a second set of unit slice circuits in the driver circuit comprises maintaining a transistor on based on a supply voltage using a slice control circuit in each of the unit slice circuits in the second set and maintaining a transistor on based on a ground voltage using a slice control circuit in each unit slice circuit in a third set of unit slice circuits in the driver circuit.

20. The method of claim 18, wherein generating an output data signal at an output of a driver circuit based on an input data signal using a first set of unit slice circuits in the driver circuit comprises:
selecting one of first or second input data signals using a multiplexer circuit in each of the unit slice circuits in a first subgroup of the unit slice circuits;
selecting one of the second input data signal or a third input data signal using a multiplexer circuit in each of the unit slice circuits in a second subgroup of the unit slice circuits;
delaying the second input data signal by one unit interval relative to the first input data signal using delay circuits; and
delaying the third input data signal by one unit interval relative to the second input data signal using the delay circuits.

21. The method of claim 18 further comprising:
increasing the amplitude of the voltage of the output data signal without changing the termination resistance at the output of the driver circuit by increasing the number of the unit slice circuits in the first set and decreasing the number of the unit slice circuits in the second set.

* * * * *